United States Patent
Chang et al.

(10) Patent No.: US 7,538,595 B2
(45) Date of Patent: May 26, 2009

(54) DC OFFSET CANCELING CIRCUIT

(75) Inventors: Chi-Tung Chang, Taipei (TW);
Chuen-Heng Wang, Taipei (TW);
Yu-Ling Chen, Taipei (TW)

(73) Assignee: Alcor Micro, Corp., Taipei (TW)

( * ) Notice: Subject to any disclaimer, the term of this patent is extended or adjusted under 35 U.S.C. 154(b) by 161 days.

(21) Appl. No.: 11/745,456

(22) Filed: May 8, 2007

(65) Prior Publication Data
US 2008/0278212 A1    Nov. 13, 2008

(51) Int. Cl.
*H03L 5/00* (2006.01)
(52) U.S. Cl. .......................................... 327/307; 330/9
(58) Field of Classification Search .................. 327/307; 330/9
See application file for complete search history.

(56) References Cited

U.S. PATENT DOCUMENTS 6,968,172 B2* 11/2005 Saito ........................... 455/306

* cited by examiner

*Primary Examiner*—Kenneth B. Wells
*Assistant Examiner*—Brandon S Cole
(74) *Attorney, Agent, or Firm*—Rosenberg, Klein & Lee

(57) ABSTRACT

The present invention provides a $ for canceling DC offset, comprising: a first circuit accumulating a first square value of a plurality of signal values in a time period; a second circuit calculation a second square value of an accumulation of said signal values in said time period, wherein said square value is divided by a quantity of said signal values in said time period to generate a DC offset value; and a third circuit, connected to said first circuit and second circuit, calculating a difference between said first square value and said DC offset value.

4 Claims, 2 Drawing Sheets

DC OFFSET CANCELING CIRCUIT

BACKGROUND OF THE PRESENT INVENTION

1. Field of Invention

The invention relates to an auto gain controller, and more particularly to an auto gain controller without the need of a DC offset canceling circuit.

2. Description of Related Arts

In order to find out the signal strength that needs to be adjusted, the traditional digital auto gain control circuit uses a set of collected signals to calculate the present dB value and subtracts the targeted dB value. Then, the signal is passed to an amplifier to amplify its signal strength to the targeted signal strength.

As shown in FIG. 1, an analog signal is passed to the amplifier 101 for amplification and to an analog-to-digital converter (not shown) for conversion. Then, the converted digital signal is passed to a DC offset cancellation circuit 102 for canceling its DC offset. Then, the output signal from circuit 102 is passed to a calculation circuit 103 for calculating the strength or energy of the present signal. Then, the calculated signal is passed to another calculating circuit 104 for calculating the signal value that need to be adjusted.

However, if the calculation is processed by the time that DC offset cancellation circuit hasn't finished its job, the error would arise due to the amount of DC offset and the present signal are calculated together. In order to make the digital auto gain control circuit adjust to the corrected targeted signal strength, the digital auto gain control circuit has to wait until the DC offset is cancelled and the current signal is calculated correctly. As a result, the auto gain control circuit would spend more time to achieve the result.

In addition, some auto gain control circuits start working after the cancellation of the DC offset is canceled by using electrical noise. However, the DC offset sometimes is varying along with the changing of the temperature or the gain value. Therefore, the noncancelable DC offset sometimes still exists after the beginning of the auto gain control. Consequently, the auto gain control cannot adjust to the targeted value because of the error of calculation.

SUMMARY OF THE PRESENT INVENTION

An object of the present invention is to provide a circuit for canceling DC offset.

Another object of the present invention is to provide an auto gain controller without the need of a DC offset canceling circuit.

Accordingly, in order to accomplish the one or some or all above objects, the circuit comprising a first circuit accumulating a first square value of a plurality of signal values in a time period; a second circuit calculation a second square value of an accumulation of said signal values in said time period, wherein said square value is divided by a quantity of said signal values in said time period to generate a DC offset value; and a third circuit, connected to said first circuit and second circuit, calculating a difference between said first square value and said DC offset value.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENT

The purpose of present invention is to design a digital auto gain control circuit that is not affected by DC offset. Such electrical circuit is able to calculate the signal strength more precisely and adjust to targeted signal strength quickly and efficiently.

Figure 1:
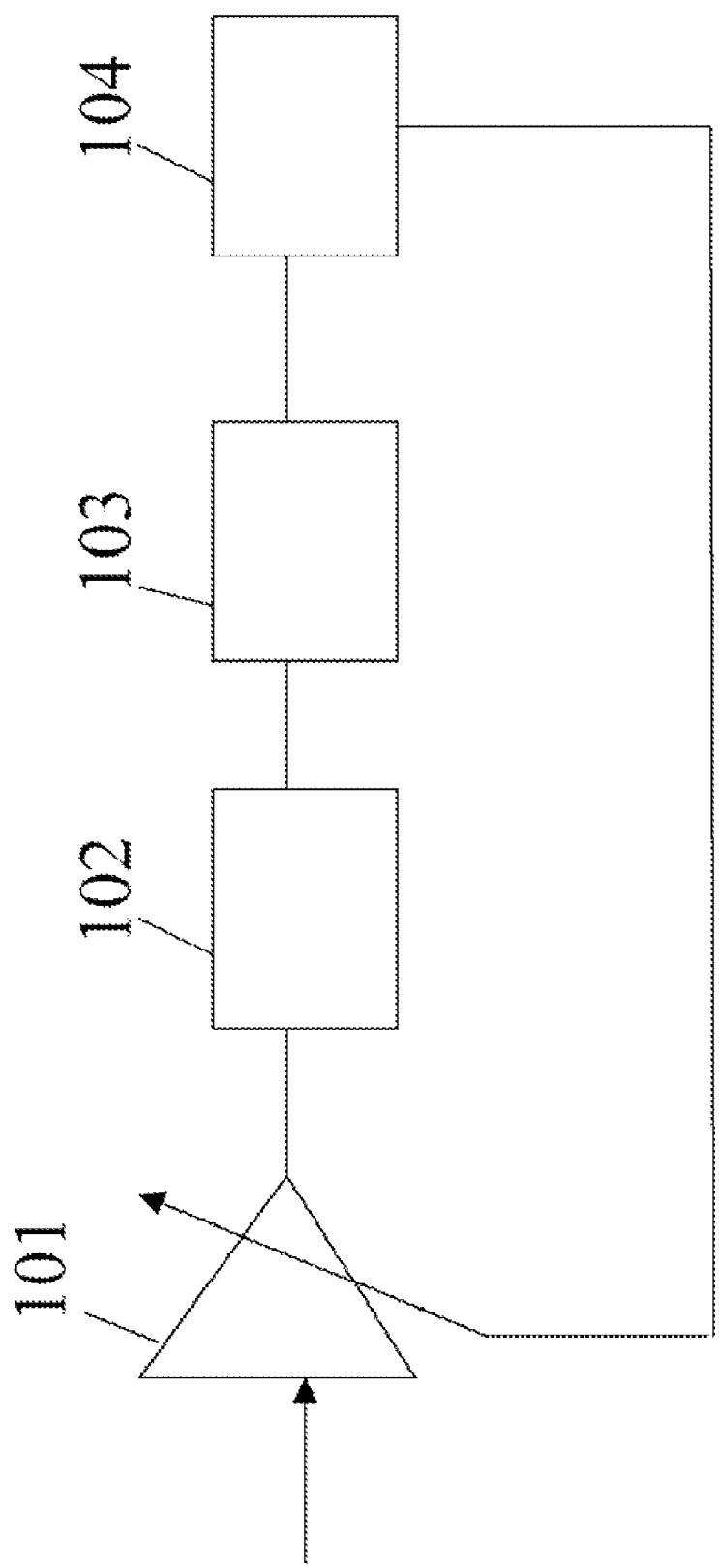
FIG. 1 illustrated a conventional design of the electrical circuit that used to cancel the DC offset.
Figure 2:
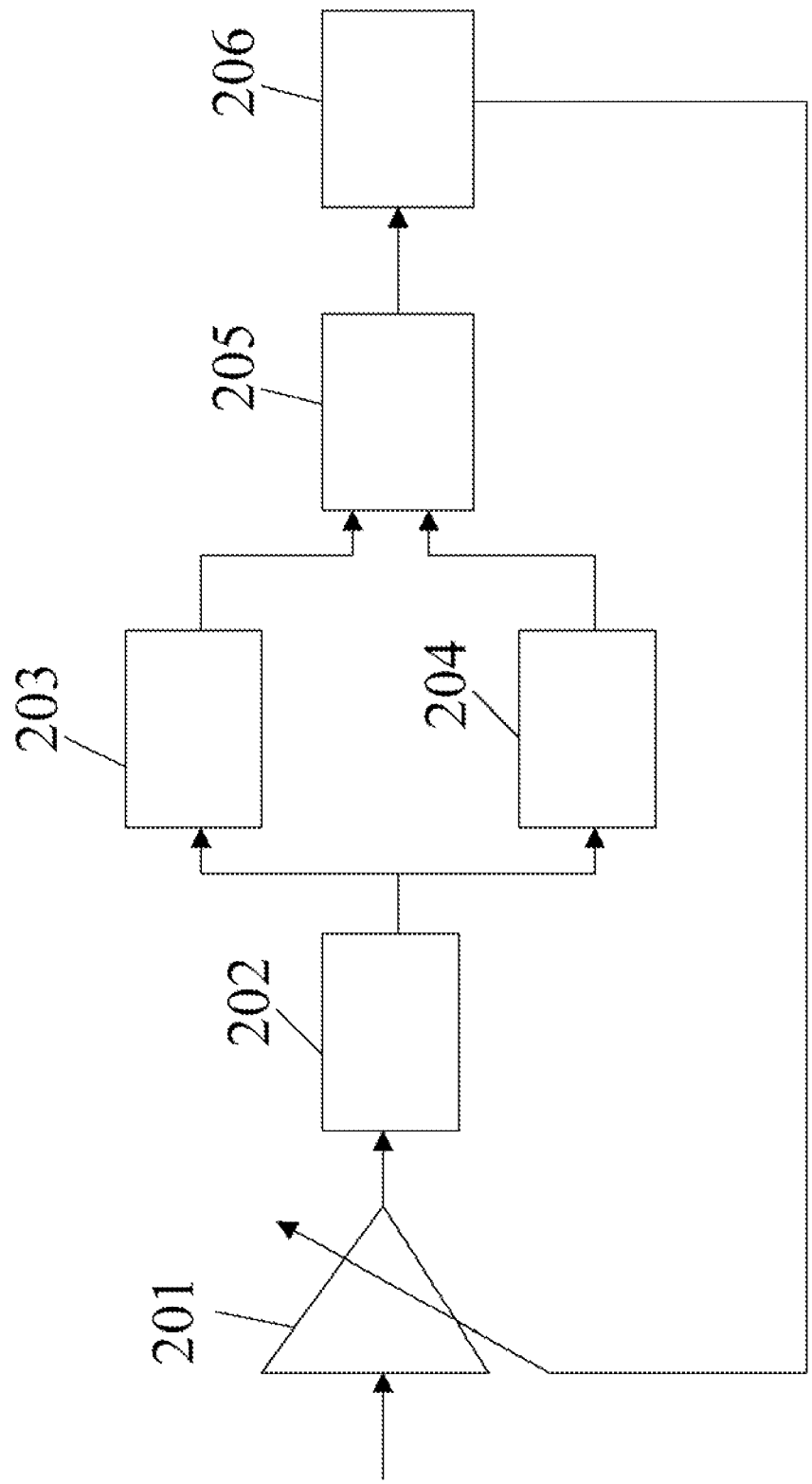
FIG. 2 illustrated the present design of the electrical circuit that used to cancel the DC offset.

Referring to FIG. 2, an embodiment of the present invention of a digital auto gain control circuit that is not affected by DC offset. The use of ANOVA (analysis of variance) in statistics is needed to cancel the DC offset. A gain amplifier 201 receives analog signals, adjusts the gain of the signals, and transfers the analog signals into digital signals by an analog-to-digital converter (not shown). DC offset canceling circuit (optional) 202 receives the adjusted signal and passes the adjusted signals to a power/energy calculating circuit 203 and a DC offset power/energy calculating circuit 204. The power/energy calculating circuit 203 calculates the total power/energy of the signals, and the DC offset power/energy calculating circuit 204 calculates the power/energy generated by the DC offset.

A DC offset canceling circuit 205 calculates the difference of the results coming from the power/energy calculating circuit 203 and the DC offset power/energy calculating circuit 204. A gain calculating circuit 206 receives the difference and transfers the difference into a dB value. The calculated dB value is compared with a predetermined dB value by the gain calculating circuit 206. A feedback value is passed to the gain amplifier 201 from the gain calculating circuit 206 so that the gain calculating circuit 206 can automatically adjust the gain for the signals. The gain amplifier 201 usually includes a serial of separate amplifiers (not shown), all providing the same amplifying value, like 2 dB. The feedback signal coming from the gain calculating circuit 206 controls the on/off of each separate amplifier. If 8 dB amplifying valued is needed, 3 serial of separate amplifiers are turned on.

The way to calculate the power in the traditional digital auto gain control circuit is:

$$\frac{\sum_{n=0}^{N-1} (S_n)^2}{N} \quad (1)$$

$S_n$ is the input signal of the digital auto gain control circuit. When the DC offset arises, $R_a = S_n + P_n$, the DC offset $P_n$ is usually a fixed value during a certain time. Meanwhile, the signal strength calculation equation is:

$$\frac{\sum_{n=0}^{N-1}(R_n)^2}{N} = \frac{\sum_{n=0}^{N-1}(S_n+P_n)^2}{N} = \frac{\sum_{n=0}^{N-1}(S_n)^2}{N} + \frac{\sum_{n=0}^{N-1}2S_nP_n}{N} + \frac{\sum_{n=0}^{N-1}(P_n)^2}{N} \quad (2)$$

If the signal average is 0, the signal strength calculation equation is:

$$\frac{\sum_{n=0}^{N-1}(R_n)^2}{N} = \frac{\sum_{n=0}^{N-1}(S_n)^2}{N} + \frac{\sum_{n=0}^{N-1}(P_n)^2}{N} \quad (3)$$

Compare (3) and (1), there is a surplus signal strength $$\frac{\sum_{n=0}^{N-1}(P_n)^2}{N}$$

that is due to the DC offset. However, when the DC offset is fixed during a certain time and the signal average is 0, the DC signal strength calculation equation is:

$$\frac{\left(\sum_{n=0}^{N-1}R_n\right)^2}{N^2} = \frac{\left(\sum_{n=0}^{N-1}S_n+P_n\right)^2}{N^2} = \frac{\left(\sum_{n=0}^{N-1}P_n\right)^2}{N^2} = \frac{\sum_{n=0}^{N-1}(P_n)^2}{N} \quad (4)$$

(4) can be used to subtract the difference between (1) and (3).

Therefore, the improved signal strength calculation of present invention is:

$$\frac{\sum_{n=0}^{N-1}(R_n)^2}{N} - \frac{\left(\sum_{n=0}^{N-1}R_n\right)^2}{N^2} \quad (5)$$

If calculate by energy, the signal energy calculation is:

$$\sum_{n=0}^{N-1}(R_n)^2 - \frac{\left(\sum_{n=0}^{N-1}R_n\right)^2}{N} \quad (6)$$

When the DC offset $P_n$ arises $R_n = S_n + P_n$. The DC offset $P_n$ is usually a fixed value during a certain time. If the signal average is 0, the signal energy calculation equation is:

$$\sum_{n=0}^{N-1}(R_n)^2 = \sum_{n=0}^{N-1}(S_n)^2 + \sum_{n=0}^{N-1}(P_n)^2 \quad (7)$$

The DC signal energy calculation equation is:

$$\frac{\left(\sum_{n=0}^{N-1}R_n\right)^2}{N} = \sum_{n=0}^{N-1}(P_n)^2 \quad (8)$$

Consequently, we can get the signal strength $$\sum_{n=0}^{N-1}(S_n)^2$$

by subtracting (8) from (7). Thus, the gain value calculation circuit can result a more precise adjusted value without the interference of the DC offset. The DC signal power/energy is calculate by the DC offset power/energy calculating circuit 204, and the total power/energy of the signals, including the input signals and the DC offset, is calculated by the power/energy calculating circuit 203.

Therefore, the faster and more efficiency digital auto gain control is due to the precise calculation of signal strength or energy that excludes the DC offset before the DC offset has been cancelled completely. When adjusting the gain value, the DC offset which caused by amplifier, other circuit, or temperature, does not affect the signal strength or energy calculation of this digital auto gain control circuit.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A circuit for canceling DC offset, comprising:
  a first circuit accumulating a first square value of a plurality of signal values in a time period;
  a second circuit calculation a second square value of an accumulation of said signal values in said time period, wherein said square value is divided by a quantity of said signal values in said time period to generate a DC offset value; and
  a third circuit, connected to said first circuit and second circuit, calculating a difference between said first square value and said DC offset value.

2. The circuit for canceling DC offset according to claim 1, further comprising a forth circuit, receiving said difference coming from said third circuit to determine a target amplifying value in accordance with a predetermined amplifying value.

3. A circuit for canceling DC offset, comprising:

a first circuit accumulating a first square value of a plurality of signal values in a time period, wherein said first square value is divided by a quantity of said signal values in said time period to generate a power value;

a second circuit calculation a second square value of an accumulation of said signal values in said time period, wherein said square value is divided by a third square value of a quantity of said signal values in said time period to generate a DC offset value, and a third circuit, connected to said first circuit and second circuit, calculating a difference between said power value and said DC offset value.

4. The circuit for canceling DC offset according claim 3, further comprising a forth circuit, receiving said difference coming from said third circuit to determine a target amplifying value in accordance with a predetermined amplifying value.

* * * * *